(12) United States Patent
Nguyen

(10) Patent No.: US 8,546,956 B2
(45) Date of Patent: Oct. 1, 2013

(54) THREE-DIMENSIONAL (3D) INTEGRATED CIRCUIT WITH ENHANCED COPPER-TO-COPPER BONDING

(71) Applicant: International Business Machines Corporation, Armonk, NY (US)

(72) Inventor: Son V. Nguyen, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/826,830

(22) Filed: Mar. 14, 2013

(65) Prior Publication Data

US 2013/0200520 A1 Aug. 8, 2013

Related U.S. Application Data

(62) Division of application No. 13/288,645, filed on Nov. 3, 2011, now Pat. No. 8,431,436.

(51) Int. Cl.
*H01L 23/488* (2006.01)
(52) U.S. Cl.
USPC ............ 257/777; 257/686; 257/778; 257/785; 257/786; 257/E25.006; 257/E25.013; 257/E25.027
(58) Field of Classification Search
USPC .......... 257/686, 777, 778, 785, 786, E25.006, 257/E25.013, E23.027
See application file for complete search history.

(56) References Cited

U.S. PATENT DOCUMENTS

| | | |
|---|---|---|
| 6,218,732 B1 | 4/2001 | Russell et al. |
| 2008/0135965 A1 | 6/2008 | Gilroy et al. |
| 2008/0265399 A1 | 10/2008 | Chao |

OTHER PUBLICATIONS

Reif, R., et al., "3-D Interconnects Using Cu Wafer Bonding: Technology and Applications", Advanced Metallization Conference, Oct. 2002 San Diego.
Nogami, T., "High Reliability 32 nm Cu/ULK BEOL Based on PVD CuMn Seed, and its Extendibility", Electron Devices Meeting (IEDM), 2010 IEEE International, Dec. 6-8, 2010, pp. 33.5.1-33.5.4.
Usui, T., et al., "Highly Reliable Copper Dual-Damascene Interconnects With Self-Formed MnSixOy Barrier Layer", IEEE Transactions on Electron Devices, Oct. 2006, vol. 53, No. 10.
Almazouzi, A., et al., "Diffusion of Manganese, Chromium, and Titanium in Single Crystalline Copper", Physica Status Solidi (a), May 1998, vol. 167, Issue 1, pp. 15-28.

(Continued)

*Primary Examiner* — Peniel M Gumedzoe
(74) *Attorney, Agent, or Firm* — Scully, Scott, Murphy & Presser, P.C.; Louis J. Percello, Esq.

(57) ABSTRACT

At least one metal adhesion layer is formed on at least a Cu surface of a first device wafer. A second device wafer having another Cu surface is positioned atop the Cu surface of the first device wafer and on the at least one metal adhesion layer. The first and second device wafers are then bonded together. The bonding includes heating the devices wafers to a temperature of less than 400° C., with or without, application of an external applied pressure. During the heating, the two Cu surfaces are bonded together and the at least one metal adhesion layer gets oxygen atoms from the two Cu surfaces and forms at least one metal oxide bonding layer between the Cu surfaces.

17 Claims, 15 Drawing Sheets

(56) References Cited

OTHER PUBLICATIONS

Iijima, J., et al., "Selective Oxidation and Resistivity Reduction of Cu-Mn Alloy Films for Self-forming Barrier Process" Proc. 2008 MRS Spring Meeting, 1079 (2008) N-03-09, Abstract only.

Koike, J., et al., "Effects of Plasma Surface Treatment on the Self-forming Barrier Process in Porus SiOCH", Proc. 2008 MRS Spring Meeting, 1079 (2008) N-03-10, Abstract only.

Neishi, K., et al., "Formation of Mn Oxide with Thermal CVD and its Diffusion Barrier Property Between Cu and SiO2", Proc. 2008 MRS Spring Meeting, 1079 (2008) N-03-11, Abstract only.

THREE-DIMENSIONAL (3D) INTEGRATED CIRCUIT WITH ENHANCED COPPER-TO-COPPER BONDING

CROSS REFERENCE TO RELATED APPLICATION

This application is a divisional of U.S. patent application Ser. No. 13/288,645, filed Nov. 3, 2011 the entire content and disclosure of which is incorporated herein by reference.

BACKGROUND

The present disclosure relates to a semiconductor structure and a method of forming the same. More particularly, the present disclosure relates to a three-dimensional (3D) integrated circuit in which improved Cu-to-Cu bonding is achieved.

To address the scaling requirements of today's electronic devices, chip designers and manufacturers are constantly trying to devise circuit designs that best maximize available chip space. The resulting designs often extend to several different planes. For example, one such three-dimensional (3D) circuit design might involve a number of different device layers oriented in a stacked configuration. In another example, a 3D circuit design might include vertical stacks consisting of multiple device layers and interconnect layers that are connected together by interlayer vertical vias.

In a typically 3D integrated circuit, two active device wafers are stacked in a back-to-back manner. The two active device wafers are then bonded together using thermal compression in which Cu-to-Cu bonding occurs. The bonding process requires both reasonable high temperatures and pressure application. In such direct Cu-to-Cu bonding, CuO forms at the Cu surfaces that are being bonded together. The presence of CuO at the Cu surfaces increases the resistance of the bonded structure and reduces the reliability, particularly, the adhesion, of the bonded structure.

As such, there is a need for an improved method for bonding Cu surfaces together in which the formation of CuO at the bonded Cu-to-Cu surface is eliminated.

SUMMARY

At least one metal adhesion layer is formed on at least a Cu surface, typically a Cu bond pad, of a first device wafer. A second device wafer having another Cu surface, typically another Cu bond pad, is positioned atop the Cu surface of the first device wafer and on the at least one metal adhesion layer. The first and second device wafers are then bonded together. The bonding includes heating the devices wafers to a temperature of less than 400° C., with or without, application of an external applied pressure. During the heating, the two Cu surfaces are bonded together and the at least one metal adhesion layer gets oxygen atoms from the two Cu surfaces and forms at least one metal oxide bonding layer between the Cu surfaces.

In one aspect of the present disclosure, a method of forming a three-dimensional (3D) integrated circuit is provided. The method of the present disclosure includes providing a first device wafer including at least a Cu surface. Next, a metal adhesion layer is formed on the Cu surface. A second device wafer having another Cu surface is positioned on the metal adhesion layer and atop the Cu surface of the first device wafer. The first and second device wafers are bonded together at a temperature of less than 400° C. During bonding, the metal adhesion layer gets oxygen atoms from the two Cu surfaces and forms a metal oxide bonding layer between the Cu surface and the another Cu surface.

Another aspect of the present disclosure relates to a three-dimensional (3D) integrated circuit. The 3D integrated circuit includes a vertical stack of a first device wafer having a Cu surface and a second device wafer having another Cu surface, wherein a metal oxide bonding layer is located between the Cu surface of the first device wafer and the another Cu surface of the second device wafer.

DETAILED DESCRIPTION

Figure 1:
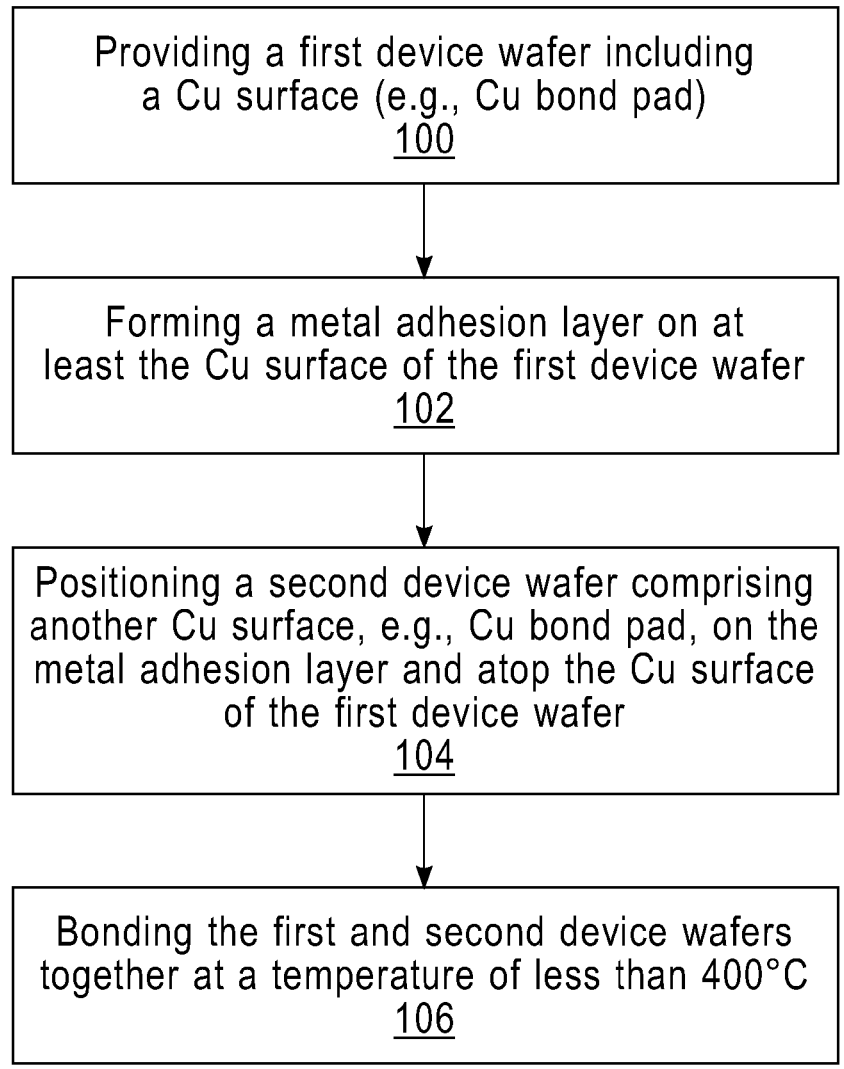
FIG. 1 is a schematic, in block diagram form, illustrating the various processing steps of the present disclosure that can be employed in forming a 3D integrated circuit.

The present disclosure, which relates to a three-dimensional (3D) integrated circuit having improved Cu-to-Cu bonding and a method of forming the same, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

It will be understood that when an element as a layer, region, or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present disclosure provides a method of forming a three-dimensional (3D) integrated circuit. The method of the present disclosure is represented schematically in the block diagram shown in FIG. 1. The method of the present disclosure includes providing a first device wafer including a Cu surface (Step 100). Next, a metal adhesion layer is formed on at least the Cu surface (Step 102) of the first device wafer. A second device wafer having another Cu surface is positioned on the metal adhesion layer and atop the Cu surface of the first device wafer (Step 104). The first and second device wafers are bonded together at a temperature of less than 400° C. (Step 106). During bonding, the metal adhesion layer gets oxygen atoms from the two Cu surfaces and forms a metal oxide bonding layer between the Cu surface of the first device wafer and the another Cu surface of the second device wafer.

The method of the present disclosure provides a three-dimensional (3D) integrated circuit that includes a vertical stack of a first device wafer comprising a Cu surface and a second device wafer comprising another Cu surface, wherein a metal oxide bonding layer is located between the Cu surface of the first device wafer and the another Cu surface of the second device wafer. The metal oxide bonding layer provides improved Cu-to Cu bonding between the different device wafers without increasing the resistance at the Cu-to-Cu bonding surface.

The term "device wafer" as used throughout the present disclosure denotes a semiconductor structure including a semiconductor substrate, at least one device located at least partially upon the semiconductor substrate, an interconnect level including at least one interconnect dielectric material having at least one conductive feature (via and/or line) embedded therein, and a Cu bond pad located on the surface of the interconnect level and in contact with at least one of the conductive features located within the at least one interconnect dielectric material. In some embodiments, the Cu bond pad can be patterned and thus be located only on some portions of the interconnect level. In other embodiments, the Cu bond pad can be non-patterned and thus be located atop the entirety of the interconnect level.

The at least one device can be a field effect transistor, a resistor, a capacitor, a BiCMOS, a diode, a conductor, a microelectromechanical (MEM) device, a thermal cooling device or any combination thereof. The devices can have the same or different polarity and the devices can have a same or different function. For example, the devices can be used as either as a memory, a microprocessor, a microcontroller, a sensor, a thermal cooling element or any combination of these functions.

Reference is first made to FIGS. 3-6 which illustrate one embodiment of the present disclosure for preparing a 3D integrated circuit using the method of the present disclosure. It is noted that although the following discussion and drawings describe and illustrate the vertical stacking and bonding of two device wafers together, the present disclosure is not limited to vertical stacking and bonding only two device wafers together. Instead, the present disclosure can be used in embodiments wherein an n number of device wafers are vertically stacked and bonded together using the method of the present disclosure, wherein n is an integer greater than 2.

Figure 2:
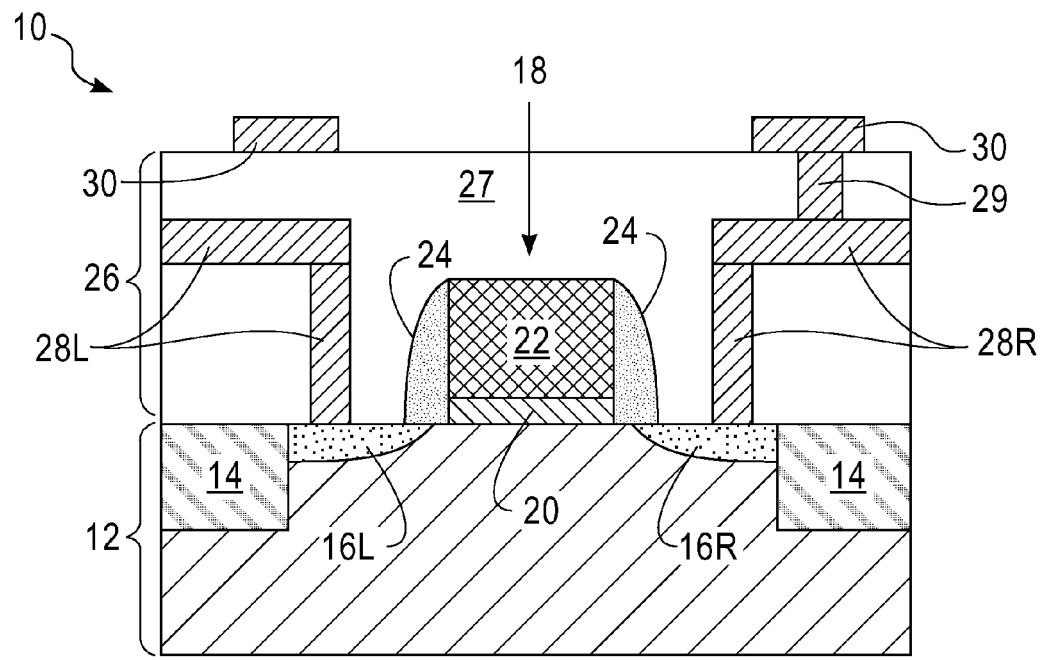
FIG. 2 is a pictorial representation (through a cross sectional view) illustrating a first device wafer including a patterned Cu bond pad that can be employed in one embodiment of the present disclosure.

Referring first to FIG. 2, there is illustrated a first device wafer 10 including patterned Cu bond pads 30 located atop interconnect level 26. The first device wafer 10 also includes at least one first device 18 located at least partially on a surface of a semiconductor substrate 12 having at least one isolation region 14 located therein. In the drawings and following discussion, the at least one first device 18 is a field effect transistor that includes a gate stack of at least a gate dielectric 20 and an overlying gate conductor 22. At least one spacer 24 can be located on the sidewalls of the gate stack (20 and 22). Source/drain regions 16L and 16R are shown at the footprint of the gate stack (20 and 22) and located within an upper portion of semiconductor substrate 12.

The interconnect level 26 includes at least one interconnect dielectric material 27 having a plurality of conductive features 28L, 28R located therein. As shown, one of the conductive features 28L of the plurality of conductive features is in contact with source/drain region 16L of the field effect transistor, while another of the conductive feature 28R of the plurality of conductive features is in contact with source/drain region 16R of the field effect transistor. As also shown, the conductive feature 268 has a conductive region, i.e., via, 29 that is in contact with a surface of one of the patterned Cu bond pads 30 that is formed atop interconnect level 26.

The first device wafer 10 illustrated in FIG. 2 can be formed utilizing techniques well known to those skilled in the art.

Also, the various components of the first device wafer 10 can be composed of materials that are also well known to those skilled in the art.

The following provides some details on how such a first device wafer 10 can be made as well as some materials for each of the components that can be present in the first device wafer 10. Although such details are provided, other methods, and/or materials that are well known to those skilled in the art can be used in forming the first device wafer 10 shown in FIG. 2.

The semiconductor substrate 12 of the first device wafer 10 can be comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). Semiconductor-on-insulator substrates include, from top to bottom, a top semiconductor device layer, an insulator layer and a bottom semiconductor portion. In some embodiments of the present disclosure, the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include different crystal orientations. For illustrative purposes the semiconductor substrate 12 of the first device wafer is comprised of a bulk semiconductor. By "bulk" it is meant that the entirety of the substrate is composed of a semiconductor material.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region 14 can be formed into the semiconductor substrate 12. The at least one isolation region 14 may be a trench isolation region or a field oxide isolation region. The trench isolation region is formed utilizing a trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. As known to those skilled in the art, the at least one isolation region 14 provides isolation between neighboring devices, typically required when the neighboring devices have opposite conductivities, i.e., nFETs and pFETs. The portion of the semiconductor substrate 12 that is located between neighboring isolation regions is referred to herein as the 'active area' of the semiconductor substrate 12. The active area of the semiconductor substrate 12 is the region in which a device will be at least partially formed thereon.

After defining the active area(s) in which a device(s) is(are) to be formed, the device(s) is(are) formed at least partially on the active area(s) of the semiconductor substrate 12. In the drawings, and as previously mentioned, the at least one first device 18 that is formed in this illustrated embodiment is a field effect transistor. The field effect transistor includes a gate stack of at least a gate dielectric 20, and a gate conductor 22.

The gate dielectric 20 includes any insulating material. In one embodiment, the gate dielectric 20 includes a semiconductor oxide, a semiconductor nitride, and/or a semiconductor oxynitride. In another embodiment, the gate dielectric 20 includes a dielectric metal oxide having a dielectric constant that is greater than the dielectric constant of silicon oxide, e.g., 3.9. Such dielectric metal oxides having a dielectric constant of greater than silicon oxide are referred to herein as a high k dielectric material. Typically, high k gate dielectrics that can be employed in the present disclosure have a dielectric constant greater than 4.0, with a dielectric constant of greater than 8.0 being even more typical. Exemplary high k dielectric materials that can be employed as gate dielectric 20 include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. In some embodiments, multilayered stacks of at least two of the above mentioned dielectric materials can be employed. For example, and in one embodiment, gate dielectric 20 can include a lower layer of a semiconductor oxide, i.e., silicon oxide, and an upper layer of a high k dielectric material, such as, for example $HfO_2$.

The thickness of the gate dielectric 20 may vary depending on the technique used to form the same. Typically, however, the gate dielectric 20 has a thickness from 0.5 nm to 10 nm, with a thickness from 1.0 nm to 5 nm being more typical. In some embodiments of the present disclosure, the gate dielectric 20 employed may have an effective oxide thickness on the order of, or less than, 1 nm.

The gate dielectric 20 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. In some embodiments, especially when a semiconductor oxide, nitride and/or oxynitride is employed as gate dielectric 20, the gate dielectric 20 can be formed by a thermal process such as, for example, thermal oxidation and/or thermal nitridation. In such an instance, the semiconductor portion of the semiconductor oxide, nitride and/or oxynitride includes a same semiconductor material as that of the underlying semiconductor substrate 12.

The gate conductor 22 of the gate stack of the at least one first device 18, i.e., field effect transistor, illustrated in FIG. 2 comprises any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate conductor 22 is comprised of nFET metal. In another embodiment, the gate conductor 22 is comprised of a pFET metal. In yet a further embodiment, the gate conductor 22 is comprised of polycrystalline silicon, with or without an underlying conductive metal portion.

The gate conductor 22 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate conductor 22, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process can be employed.

In some embodiments, the gate dielectric 20 and the gate conductor 22 are formed as blanket layers and thereafter a patterning process is used in forming the gate stack including the same. The patterning process includes lithography (applying a photoresist atop the upper surface of the gate conductor 22, exposing the photoresist to radiation and developing the exposed resist using a conventional developer). The lithography step provides a patterned photoresist atop the blanket layer of gate conductor 22. An etching step is then used to transfer the pattern from the patterned photoresist into the underlying blanket layers of gate dielectric and gate conductor materials. The etching may include a dry etching process such as, for example, reactive ion etching, plasma etching, ion etching or laser ablation. The etching may further include a wet chemical etching process in which one or more chemical etchants are used to remove portions of the blanket layers of the gate dielectric and gate conductor materials that are not protected by the patterned photoresist. The patterned photoresist can be removed utilizing an ashing process.

In other embodiments, the gate stack including the gate dielectric 20 and the gate conductor 22 are formed using a replacement gate process. In such a process, a stack including at least a sacrificial gate material is formed into an opening that is present in a planarizing dielectric material. At least the sacrificial gate material is removed and then replaced with one of the above mentioned gate conductor materials. In some embodiments, the replacement gate process may include a sacrificial gate dielectric material as well. In such embodiments, the sacrificial gate material and the sacrificial gate dielectric are both removed and replaced with one of the above mentioned gate conductor materials and one of the above mentioned gate dielectric materials.

The field effect transistor illustrated as the at least one first device 18 can further include at least one spacer 24. In some embodiments, the at least one spacer 24 can be omitted from the sidewalls of the gate stack including at least gate dielectric 20 and gate electrode 22. When present, the at least one spacer 24 is comprised of an oxygen impermeable dielectric material such as, for example, silicon oxide, silicon nitride and/or silicon oxynitride. The at least one spacer 24 can be formed by deposition of an oxygen impermeable dielectric material and then etching. In some embodiments, a thermal process can be used in forming the at least one spacer 24.

The field effect transistor (i.e., the at least one first device 18) illustrated in FIG. 2 also includes source/drain regions 16L and 16R. The source/drain regions 16L and 16R can be formed prior to, or after, formation of the gate stack including gate dielectric 20 and gate conductor 22 utilizing ion implantation and annealing. The conditions and dopants for the ion implantation process are well known to those skilled in the art. The anneal, which activates the dopants that are ion implanted into the semiconductor substrate 12, includes heating at a temperature of about 800° C. or above. The portion of the semiconductor substrate 12 that is located beneath the gate stack (20 and 22) and laterally bounded by the source/drain regions 16L, 16R, is a channel region of the transistor.

After forming the at least one first device 18, an interconnect level 26 is formed. Interconnect level 26 may represent a single interconnect level or it may represent multiple vertically stacked and electrically connected interconnect levels. The interconnect level 26 includes at least one interconnect dielectric material 27 having a plurality of conductive features 28L and 28R located therein. One of the conductive features 28L of the plurality of conductive features is in contact with source/drain region 16L of the field effect transistor, while another of the conductive feature 28R of the plurality of conductive features is in contact with source/drain region 16R of the field effect transistor. The conductive feature 28R has a conductive region, i.e., via, 29 that is in contact with a surface of one of the patterned Cu bond pads 30 that is formed atop interconnect level 26.

The interconnect level 26 is formed using techniques well known in the art including for example, a damascene process. In a damascene process, the at least one interconnect dielectric material 27 is first formed and then a plurality of openings are formed into the at least one interconnect dielectric material 27 using lithography and etching. The plurality of openings can be via openings, line openings or combination of via and line openings. When the openings are defined by a combination of via and line openings, a second iteration of lithography and etching can be used. In such a combination of openings, the vias and lines are in communication with each other.

The openings are then filled with a conductive material forming conductive features 28L and 28R.

In some embodiments, conductive region 29 can be formed at the same time as the conductive features 28L and 28R. In other embodiments, the conductive region 29 can be formed after the conductive features 28L and 28R. In such an embodiment, the conductive features 28L and 28R each have an uppermost surface that is substantially coplanar with an upper surface of a first interconnect dielectric material. A second interconnect dielectric material (same or different from the first interconnect dielectric material) is then formed and conductive region 29 is formed using the same technique as mentioned above for forming conductive features 28L and 28R. In this particular embodiment, the first and second interconnect dielectric materials form a multilevel interconnect structure that can be used in some embodiments of the present disclosure.

The at least one interconnect dielectric material 27 of interconnect level 26 may comprise any interlevel or intralevel dielectric including inorganic dielectrics or organic dielectrics. The at least one interconnect dielectric material 27 may be porous or non-porous. Porous dielectric materials generally have a lower dielectric constant than the non-porous counterparts. Some examples of suitable dielectrics that can be used as the at least one interconnect dielectric material 27 include, but are not limited to, $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In one embodiment, the at least one interconnect dielectric material 27 has a dielectric constant that is about 4.0 or less. In another embodiment, the at least one interconnect dielectric material 27 has a dielectric constant of about 2.8 or less. All dielectric constants mentioned in this disclosure are relative to a vacuum unless otherwise noted. The thickness of the at least one interconnect dielectric material 27 may vary depending upon the dielectric material used as well as the exact number of dielectrics within interconnect level 26. Typically, and for normal interconnect structures, the at least one interconnect t dielectric material 27 has a thickness from 200 nm to 450 nm.

The conductive features 28L and 28R as well conductive region 29 comprise a conductive material including, for example, polySi, a conductive metal, an alloy comprising at least two conductive metals, a conductive metal silicide or combinations thereof. In one embodiment, the conductive material that is used in forming the conductive features 28L and 28R and conductive region 29 is a conductive metal such as Cu, W or Al. The conductive features 28L and 28R may be comprised of the same or different conductive material as conductive region 29.

The conductive material used in forming the conductive features 28L and 28R and conductive region 29 is formed utilizing a conventional deposition process including, but not limited to: CVD, PECVD, sputtering, chemical solution deposition or plating. After deposition, a conventional planarization process such as, for example, chemical mechanical polishing (CMP) can be used to provide a planar interconnect structure.

The patterned Cu bond pads 30 are formed atop interconnect level 26 by first forming a blanket layer of Cu or Cu alloy atop interconnect level 26 utilizing one of the techniques mentioned above for forming the conductive material of conductive features 28L and 28R and conductive region 29. Next, lithography and etching is employed in forming the patterned Cu bond pads 30. As shown, one of the patterned Cu bond pads 30 is in contact with an upper surface of conductive region 29. Although patterned Cu bond pads 30 are shown and described in this embodiment, an embodiment will be described in which a non-patterned Cu bond pad is employed.

Figure 3:
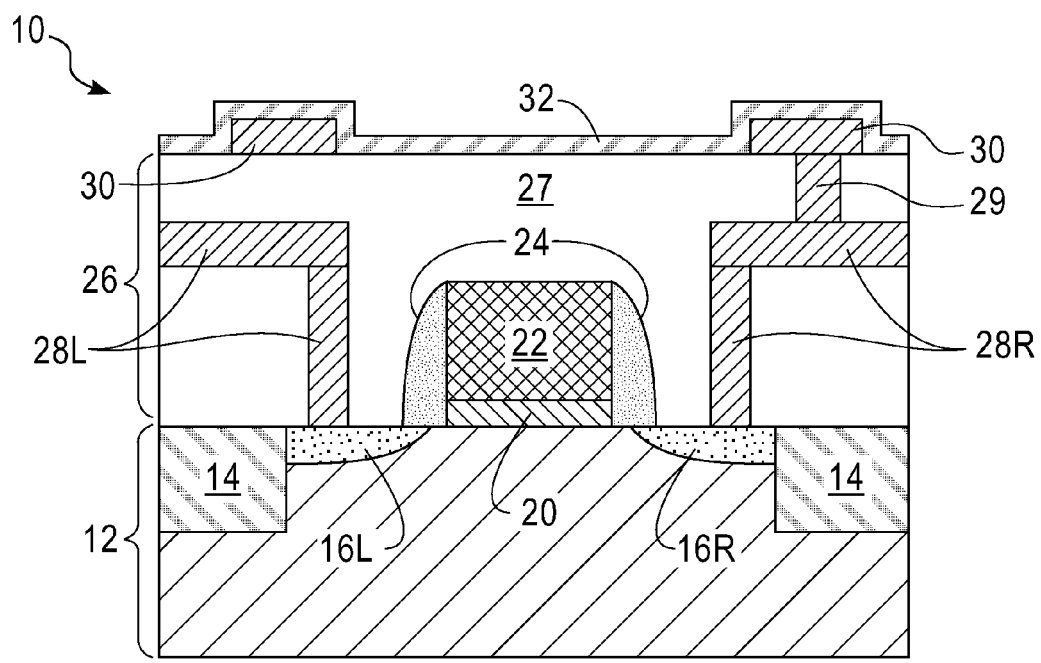
FIG. 3 is a pictorial representation (through a cross sectional view) illustrating the first device wafer of FIG. 2 after forming a metal adhesion layer on at least the Cu bond pad of the first device wafer.

Referring now to FIG. 3, there is illustrated the first device wafer 10 of FIG. 2 after forming a metal adhesion layer 32 on at least the Cu bond pads 30 of the first device wafer 10. The metal adhesion layer 32 is formed in this embodiment utilizing a non-selective deposition process, such as, for example, evaporation, physical vapor deposition, argon sputtering, chemical vapor deposition, plasma enhance chemical vapor deposition or atomic layer deposition. By "non-selective" it is meant a deposition process in which the metal adhesion layer 32 is formed on all exposed surfaces.

The metal adhesion layer 32 consists of a metal or metal alloy that has a higher affinity for oxygen than Cu or a Cu alloy. Stated in other terms, the metal adhesion layer 32 consists of a metal or metal alloy that is more oxygen reactive than Cu or a Cu alloy. Specifically, the metal adhesion layer 32 includes one of Mn, Ti, Co, Ta, W, Ru, and Ni. In one embodiment, the metal adhesion layer 32 includes Mn or Mn alloyed with at least one of Ti, Co, Ta, W, Ni and Ru. In another embodiment, the metal adhesion layer 32 includes a metal alloy including two or more metals selected from Mn, Ti, Co, Ta, W, Ni and Ru.

The thickness of the metal adhesion layer 32 may vary depending on the metal or metal alloy employed as well as the conditions of the process that was used in forming the same. In one embodiment, the metal adhesion layer 32 has a thickness from 0.2 nm to 20 nm. In another embodiment, the metal adhesion layer 32 has a thickness from 0.5 nm to 5 nm. In some embodiments, metal adhesion layer 32 is a single layered material. In another embodiments, the metal adhesion layer 32 includes multilayers. When multilayers are employed, each metal adhesion material within the multilayered structure may be the same or different.

Figure 4:
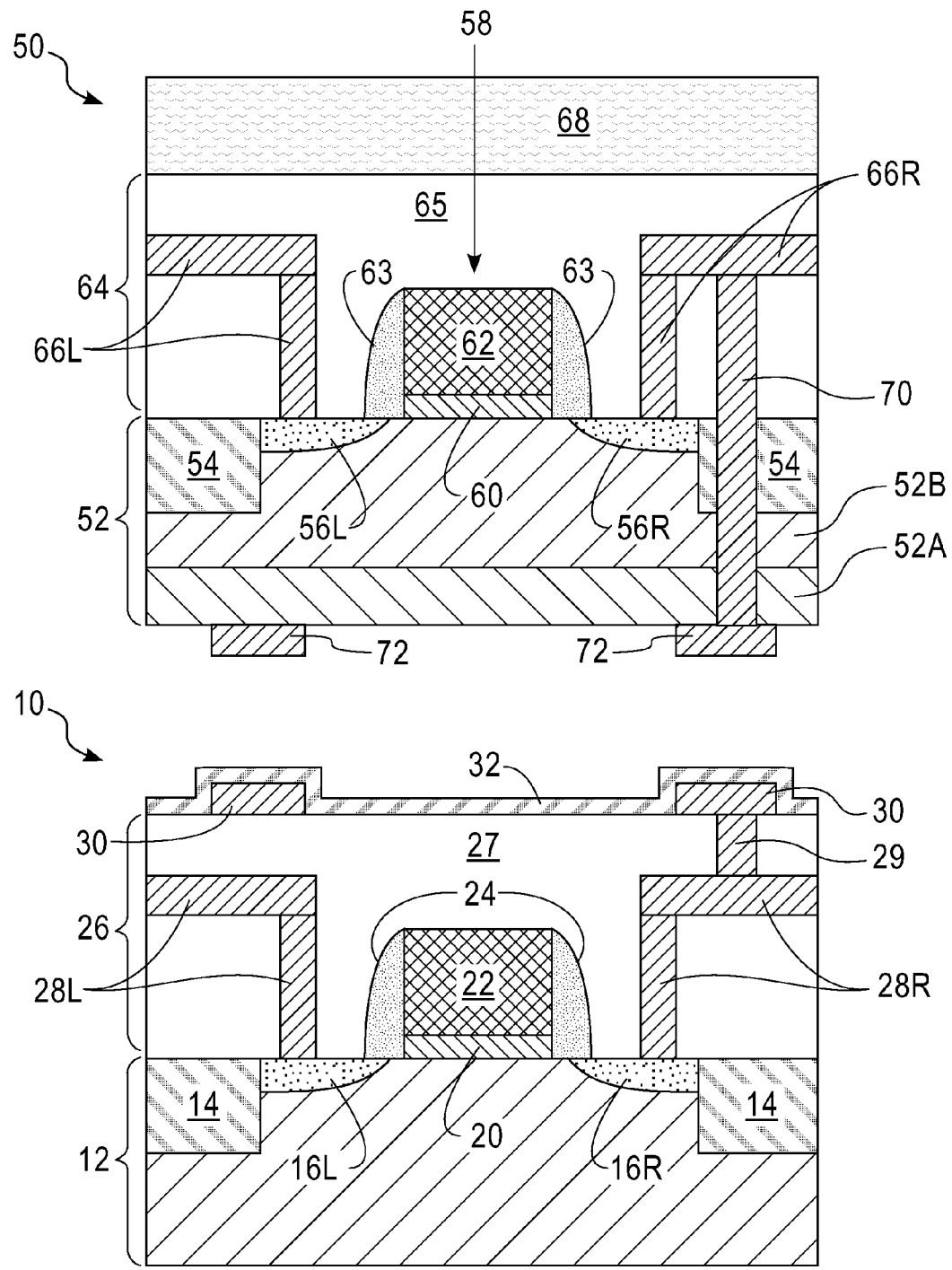
FIG. 4 is a pictorial representation (through a cross sectional view) illustrating a second device wafer including at least one other Cu bond pad positioned atop the first device wafer shown in FIG. 3.

Referring now to FIG. 4, there is illustrated a second device wafer 50 including patterned Cu bond pads 72 positioned atop the first device wafer 10 shown in FIG. 3. The second device wafer 50 includes a semiconductor substrate 52 that includes a semiconductor device layer 52B and an insulator layer 52A. The semiconductor device layer 52B includes one of the semiconductor materials mentioned above for semiconductor substrate 12. The thickness of the semiconductor device layer 52B is typically within a range from 5 nm to 5000 nm. Other thicknesses that are above or below the aforementioned thickness range can also be employed in the present disclosure.

The insulator layer 52A includes a semiconductor oxide, semiconductor nitride and/or semiconductor oxynitride. The thickness of the insulator layer 52A is typically within a range from 5 nm to 500 nm. Other thicknesses that are above or below the aforementioned thickness range can also be employed in the present disclosure.

In one embodiment, the insulator layer 52A and the semiconductor device layer 52B are components of a semiconductor-on-insulator substrate in which the bottom semiconductor portion of the substrate was removed during fabrication of the second device wafer 50 illustrated in FIG. 4. In such an embodiment, the bottom semiconductor portion of the substrate can be removed by etching or by utilizing a planarization process such as, for example, CMP and/or grinding. The removal of the bottom semiconductor portion of the semiconductor-on-insulator substrate typically occurs after forming a handle substrate (or handle wafer) atop the second device wafer 50.

In some embodiments, the insulator layer 52B is formed on a bottom surface of a bulk semiconductor substrate (which represents semiconductor device layer 54) after the bulk semiconductor substrate has been processed to include at least one device, one interconnect level and a handle substrate.

The semiconductor device layer 52B includes at least one isolation region 54 formed therein. The at least one isolation region 54 can be formed and include materials as described above for the at least one isolation region 14.

The second device wafer 50 further includes at least one second device 58 formed at least partially atop semiconductor device layer 52A. In this embodiment, the at least one second device 58 is a field effect transistor that includes a gate stack of at least gate dielectric 60 and gate conductor 62. The gate dielectric 60 and gate conductor 62 can be formed and include materials and thicknesses that were described above for gate dielectric 20 and gate conductor 22.

The field effect transistor (i.e., at least one second device 58) further includes source/drain regions 56L and 56R located within the semiconductor device layer 52B and at the footprint of the gate stack including gate dielectric 60 and gate conductor 62. The source/drain regions 56L and 56R can be formed as described above for forming source/drain regions 16L and 16R. The region of the semiconductor device layer 52A located beneath gate stack (60 and 62) and laterally bounded by source/drain regions 56L, 56R is a channel region of the at least one second device 58.

At least one spacer 63 can be present on the sidewalls of the gate stack (i.e., 60 and 62). The at least one spacer 63 can be comprised of one of the materials mentioned above for the at least one spacer 24. The at least one spacer 63 can be formed using the same techniques as mentioned above in forming the at least one spacer 24.

The second device wafer 50 further includes interconnect level 64 that includes a plurality of conductive features 66L and 66R located within at least one interconnect dielectric material 65. Interconnect dielectric material 65 can be formed and include materials and thicknesses that were mentioned above for interconnect dielectric material 27. The conductive features 66L and 66R can be formed and include materials as mentioned above for conductive features 28L and 28R.

After forming the at least one second device 58 and interconnect level 64, a handle substrate 68 is formed on the uppermost surface of interconnect level 64. The handle substrate 68 may be comprised of glass, $Al_2O_3$, SiN or other easy to remove insulating material such as, for example, carbon, a spin-on organic/inorganic polymer, or a flexible tape. The handle substrate 68 can be formed utilizing conventional techniques well known to those skilled in the art including a layer transfer process.

Next, and if present, a bottom portion of a semiconductor-on-insulator can be removed as described above and then, if not present, the insulator layer 52A can be formed utilizing thermal growth or a deposition process such as, for example, CVD, PECVD, and chemical solution deposition.

Next, a through via 70 can be formed through the semiconductor substrate 52 and through at least a portion of the interconnect dielectric material 65. On end portion of the though via 70 contacts a horizontal surface of at least one of the conductive features, i.e., 66R, while another end portion is located at the bottom most surface of substrate 52.

The through via 70 includes one of the conductive materials mentioned above for conductive features 28L and 28R and it is formed utilizing lithography and etching, followed by forming a conductive material within a via opening that was created by the lithographic and etching process. The conductive material of through via 70 can be comprised of one of the conductive materials mentioned above for conductive features 28L and 28R. The conductive material of through via 70 can be formed by using one of the techniques mentioned above for forming conductive features 28L and 28R. A planarization process such as CMP can be used to provide a planar structure.

After forming the through via 70, Cu bond pads 72 are formed on the surface of insulator layer 52A. As shown, one of the Cu bond pads 72 is in contact with an end portion of the through via 70. The Cu bond pads 72 are patterned in this embodiment of the present disclosure. In some embodiments, a non-patterned Cu bond pad (not shown) can be used. Also, and in another embodiment of the present disclosure, another metal adhesion layer can be formed on at least the surface of Cu bond pads 72. This embodiment is not illustrated in the drawings of the present disclosure. When another metal adhesion layer is formed on at least Cu bond pads 72, the another metal adhesion layer can be formed and contain a material as mentioned above for metal adhesion layer 32. The another metal adhesion layer can be a same or different, typically a same, metal or metal alloy as metal adhesion layer 32.

Figure 5:
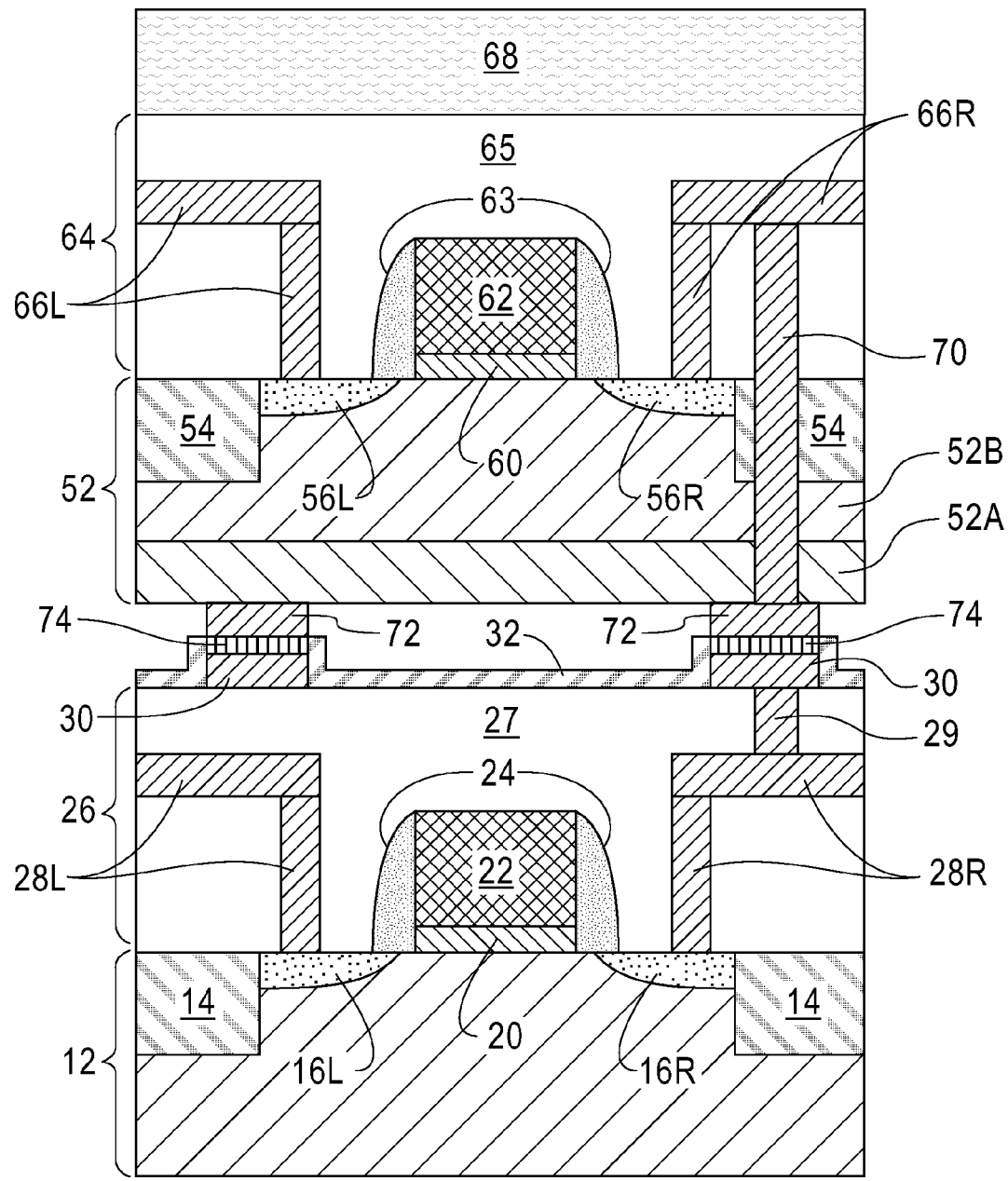
FIG. 5 is a pictorial representation (through a cross sectional view) illustrating the two devices wafers of FIG. 4 after bonding at a temperature of less than 400° C.

Referring to FIG. 5, there is illustrated the two devices wafers 10 and 50 of FIG. 4 after bringing the two device wafers 10 and 50 into intimate contact with each other, aligning the two wafers such that a Cu surface of each Cu bond pad 72 is located atop and substantially vertically aligned with a Cu surface of each Cu bond pad 30, and bonding at a temperature of less than 400° C. In another embodiment, the bonding occurs at a temperature from 50° C. to 375° C.

In some embodiments, an external force such as supplied by hand or a vice or other like mechanical means can be applied to the two device wafers during the bonding process. In another embodiment, no external force is applied to the two device wafers during the bonding process.

The bonding can be performed in an ambient that is inert to that of the two device wafers being bonded together. In one embodiment, the bonding is performed in an inert gas including for example, He, Ar, Ne, Xe and mixtures thereof. In another embodiment, nitrogen can be used as the ambient during the bonding process. Nitrogen can be used alone, or admixed with one of the inert gases mentioned above. In another embodiment, a forming gas (i.e., a mixture of hydrogen (mole fraction varies) and nitrogen, can be employed as the ambient during bonding.

During bonding, a portion of the metal adhesion layer 32 that is positioned on the Cu bond pads gets oxygen atoms from the two Cu surfaces and forms a metal oxide bonding layer 74 between the Cu surface of Cu bond pads 30 and the another Cu surface of Cu bond pads 72. As such, the Cu bond pads 30 and the Cu bond pads 72 after bonding have less oxygen therein as compared with the Cu bond pads before bonding takes place. A 50-99% reduction of oxygen in each of Cu bond pads 30 and Cu bond pads 72 can be achieved in the present disclosure, depending on the type of metal adhesive layer and bonding processing conditions employed.

The metal oxide bonding layer 74 thus includes a metal or a metal alloy and oxygen. The metal oxide bonding layer 74 is shown to be located between the Cu surface of Cu bond pads 30 and the Cu surface of Cu bond pads 72 and vertically aligned to edges of Cu bonds 30 and Cu bond pads 72. The metal oxide bonding layer 74 has a thickness that is typically with a range from 0.3 nm to 100 nm, with a thickness from 1 nm to 10 nm being more typical depending on the initial metal adhesive layer thickness and the amount of oxygen originally incorporated in the Cu bond pad. Other thicknesses that are greater than or lesser than the aforementioned thickness ranges can also be employed in the present disclosure. In some embodiments, the metal oxide bonding layer 74 is single layered structure. In other embodiments, the metal oxide bonding layer 74 is a multilayered structure. When the metal oxide bonding layer 74 is a multilayered structure, each layer of the multilayered structure may have the same or different composition.

Figure 6:
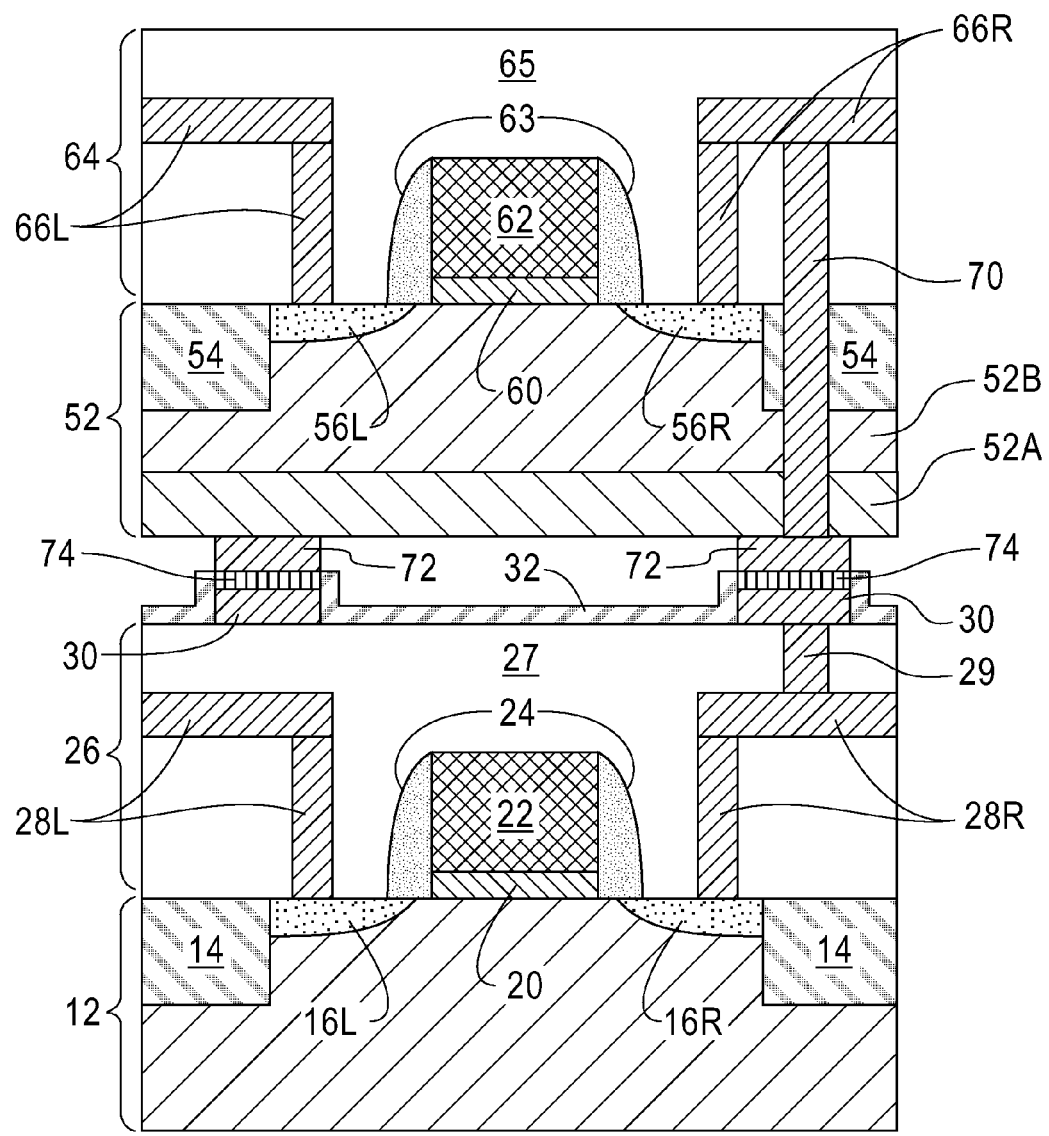
FIG. 6 is a pictorial representation (through a cross sectional view) illustrating the two devices wafers of FIG. 5 after removing a handle substrate from the second device wafer.

Reference is now made to FIG. 6, illustrating the bonded two devices wafers of FIG. 5 after removing handle substrate 68 from the second device wafer 50. In one embodiment, the handle substrate 68 can be removed utilizing a selective etching process such as, for example, an $O_2$ plasma, if the handle substrate is hydrocarbon based, or hot phosphoric acid, if the handle substrate is SiN. In another embodiment, chemical mechanical planarization and/or grinding can be used to remove the handle substrate 68 from the bonded structure.

Further device wafers can be stacked atop the structure shown in FIG. 6 and bonding between the further device wafers and the bonded structure can be achieved utilizing the same basic processing steps as described above. As such, a 3D integrated circuit can be formed including multiple device wafers stacked vertically one atop the other.

Reference is now made to FIGS. 7-11 which illustrate another embodiment of the present disclosure. This embodiment that is illustrated in FIGS. 7-11 is similar to the embodiment that was illustrated in FIGS. 2-6 above except that non-patterned Cu bond pads are employed.

Figure 7:
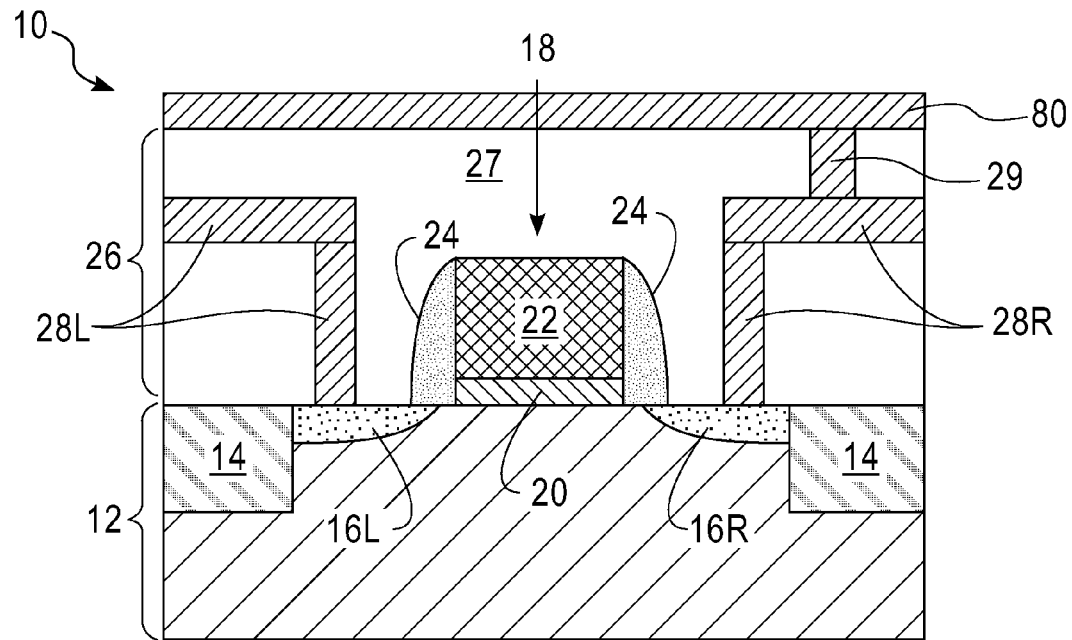
FIG. 7 is a pictorial representation (through a cross sectional view) illustrating a first device wafer including a non-patterned Cu bond pad that can be employed in one embodiment of the present disclosure.

Reference is first made to FIG. 7, which illustrates a first device wafer 10 including a non-patterned Cu bond pad 80 that can be employed in one embodiment of the present disclosure. Specifically, the first device wafer 10 includes the same components as the first device wafer 10 illustrated in FIG. 2 except that the patterned Cu bond pads 30 of FIG. 1 is replaced with a non-patterned Cu bond pad 80. The non-patterned Cu bond pad 80 is formed utilizing a deposition process as mentioned above for forming the patterned Cu bond pads 30. Following deposition of the blanket layer of Cu bond pad, no patterning of the blanket Cu bond pad occurs.

The material and thickness of the non-patterned Cu bond pad 80 are the same as that mentioned above for the patterned Cu bond pads 30.

Figure 8:
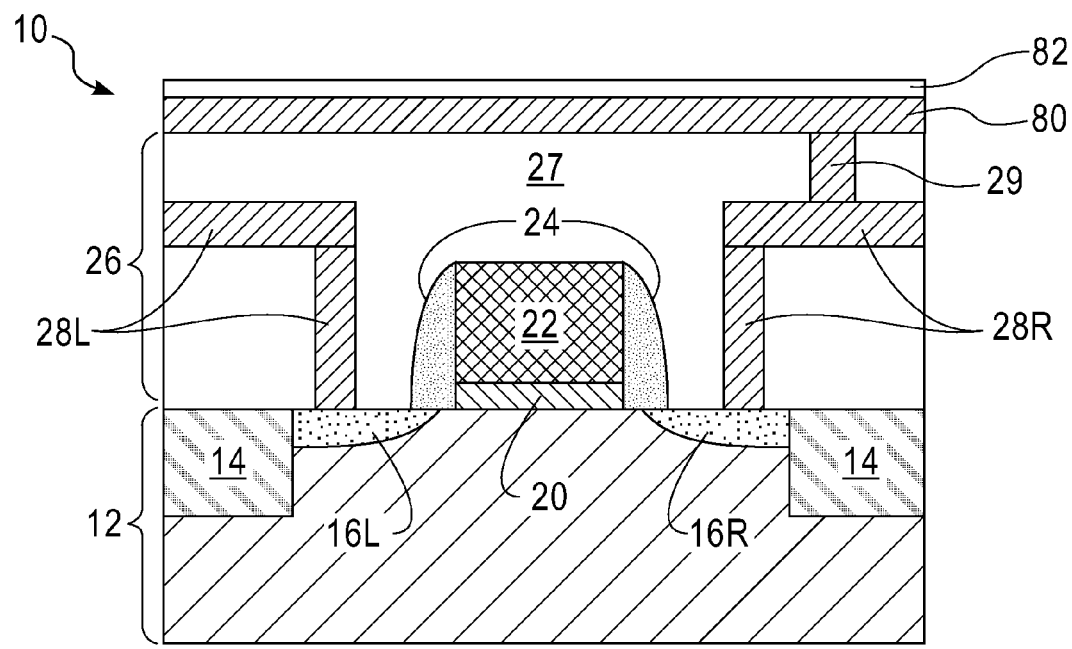
FIG. 8 is a pictorial representation (through a cross sectional view) illustrating the first device wafer of FIG. 7 after forming a metal adhesion layer on the non-patterned Cu bond pad of the first device wafer.

Referring now to FIG. 8, there is illustrated the first device wafer of FIG. 7 after forming a metal adhesion layer 82 on the non-patterned Cu bond pad 80 of the first device wafer. The metal adhesion layer 82 can be formed and include materials and thickness as described above for metal adhesion layer 32.

Figure 9:
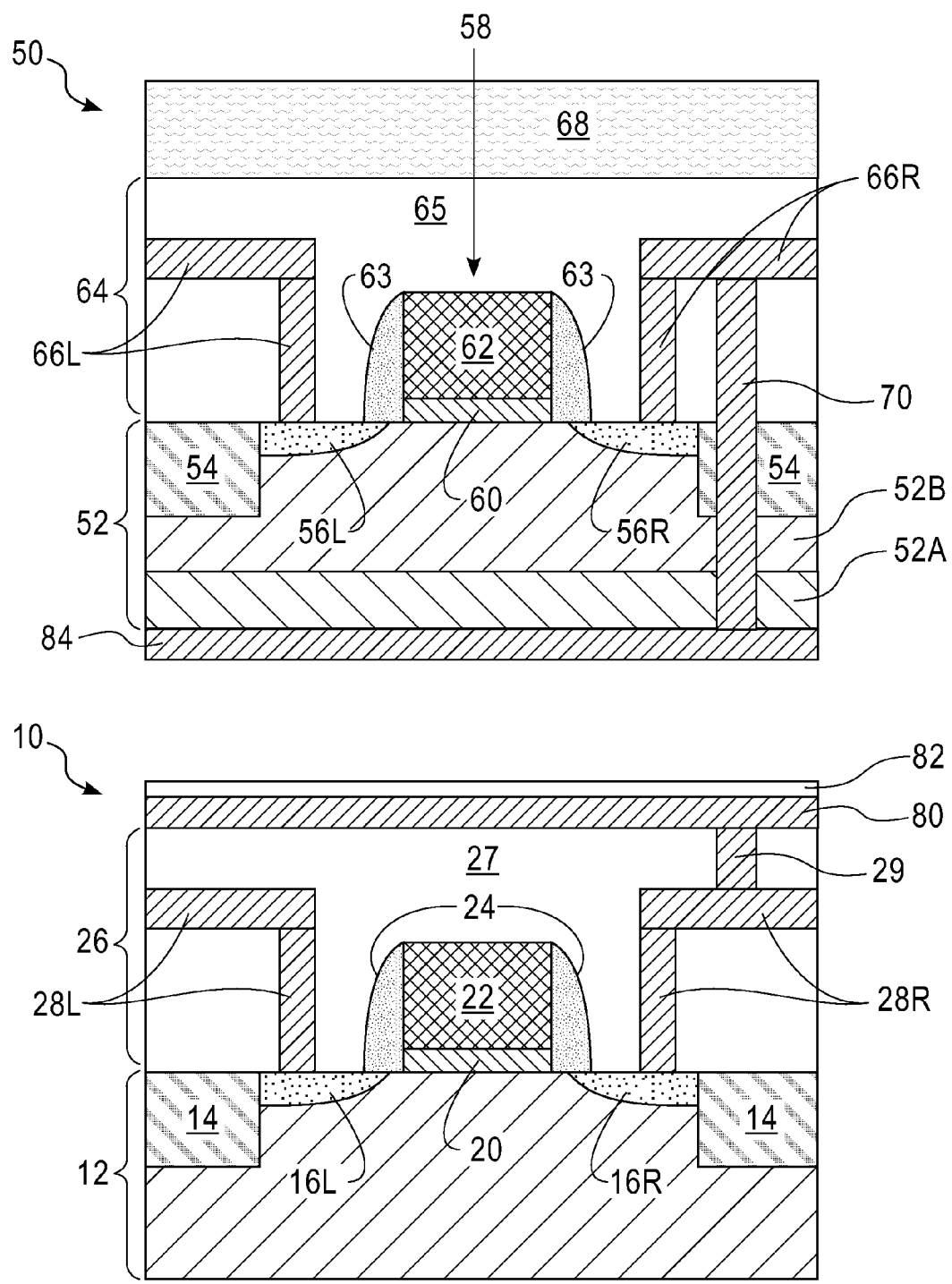
FIG. 9 is a pictorial representation (through a cross sectional view) illustrating a second device wafer position including at least one other Cu bond pad positioned atop the first device wafer shown in FIG. 8.

Referring to FIG. 9, there is illustrated a second device wafer 50 including another non-patterned Cu bond pad 84 positioned atop the first device wafer 10 shown in FIG. 8. The second device wafer 50 includes the same elements as the second device wafer 50 mentioned above except that the patterned Cu bond pads 72 are replaced with a non-patterned Cu bond pad 84. The non-patterned Cu bond pad 84 is formed utilizing a deposition process as mentioned above for forming the patterned Cu bond pads 30. Following deposition of the blanket layer of Cu bond pad, no patterning of the blanket Cu bond pad occurs. The material and thickness of the non-patterned Cu bond pad 84 are the same as that mentioned above for the patterned Cu bond pads 30.

Figure 10:
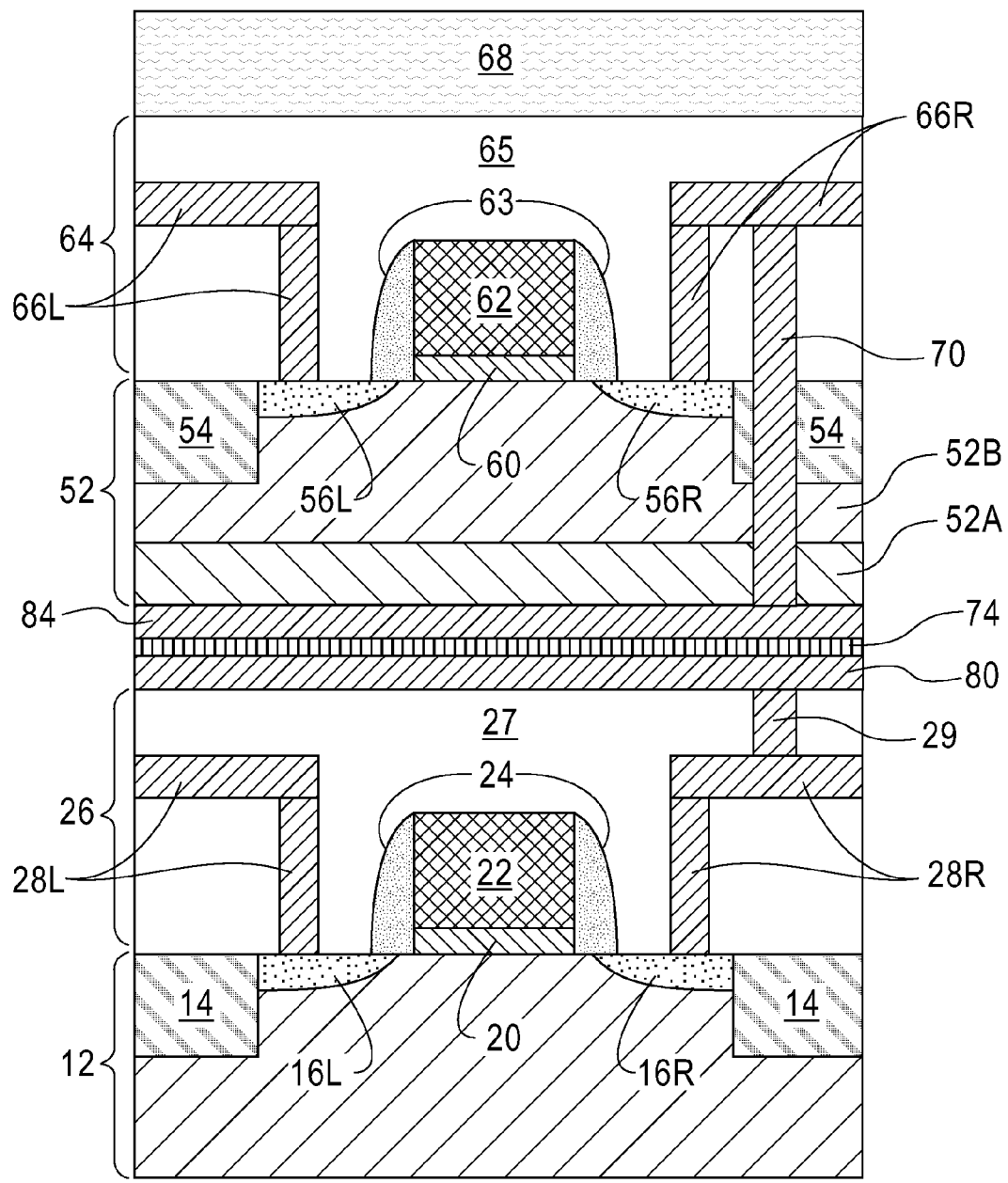
FIG. 10 is a pictorial representation (through a cross sectional view) illustrating the two devices wafers of FIG. 9 after bonding at a temperature of less than 400° C.

Referring now to FIG. 10, there is depicted the two devices wafers of FIG. 9 after bonding at a temperature of less than 400° C. Other details and embodiments of the bonding process described in conjunction with forming the bonded structure illustrated in FIG. 5 can also be used here for forming the bonded structure illustrated in FIG. 9. Unlike the previous embodiment, the metal oxide bonding layer 74 is present contiguously between the non-patterned Cu bond pad 80 and the non-patterned Cu bond pad 84. Like the previous embodiment, the non-patterned Cu bond pad 80 and the non-patterned Cu bond pad 84 after bonding have less oxygen therein as compared to the non-patterned Cu bond pad 80 and the non-patterned Cu bond pad 84 prior to bonding.

Figure 11:
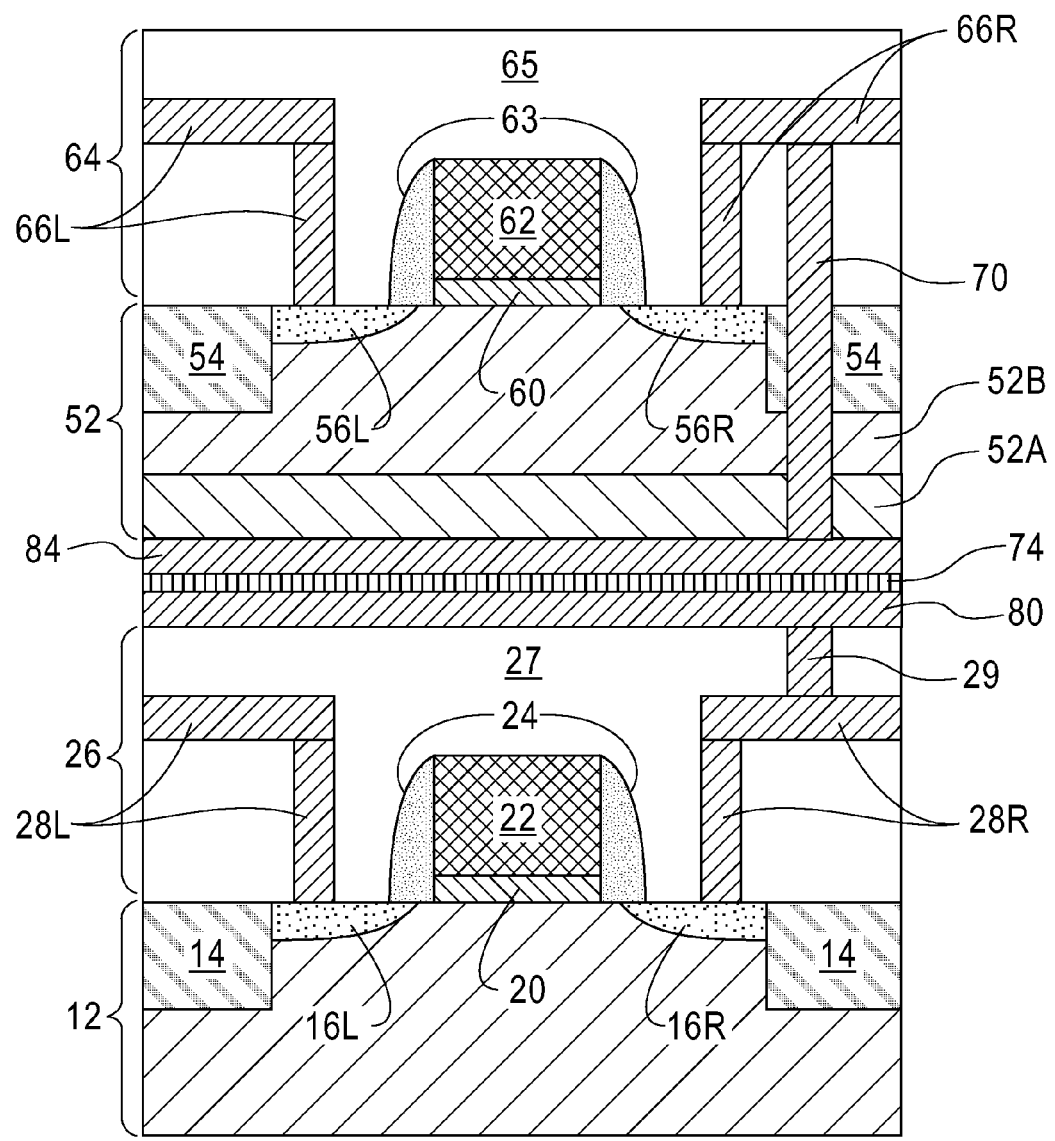
FIG. 11 is a pictorial representation (through a cross sectional view) illustrating the two devices wafers of FIG. 10 after removing a handle substrate from the second device wafer.

Referring now to FIG. 11, there is illustrated the two bonded devices wafers of FIG. 10 after removing handle substrate 68 from the second device wafer 50. The details for removing the handle substrate 68 are the same as mentioned in the previous embodiment of the present disclosure.

Further device wafers can be stacked atop the bonded structure shown in FIG. 11 and bonding between the further device wafers and the bonded structure can be achieved utilizing the same basic processing steps as described above. As such, a 3D integrated circuit can be formed including multiple device wafers stacked vertically one atop the other.

Referring now to FIGS. 12-15, there is depicted another embodiment of the present disclosure. This embodiment of the present disclosure begins with first providing a first device wafer 10 and a second device wafer 10'. The components of the first device wafer 10 are similar to those present in the first device wafer 10 illustrated in FIG. 2. The components of the second device wafer 10' are the same as that mentioned above for the first device wafer 10 illustrated in FIG. 2. A prime designation is used to distinguish components of the second device wafer 10' that are nonetheless equivalent to the components of the first device wafer 10.

Figure 12:
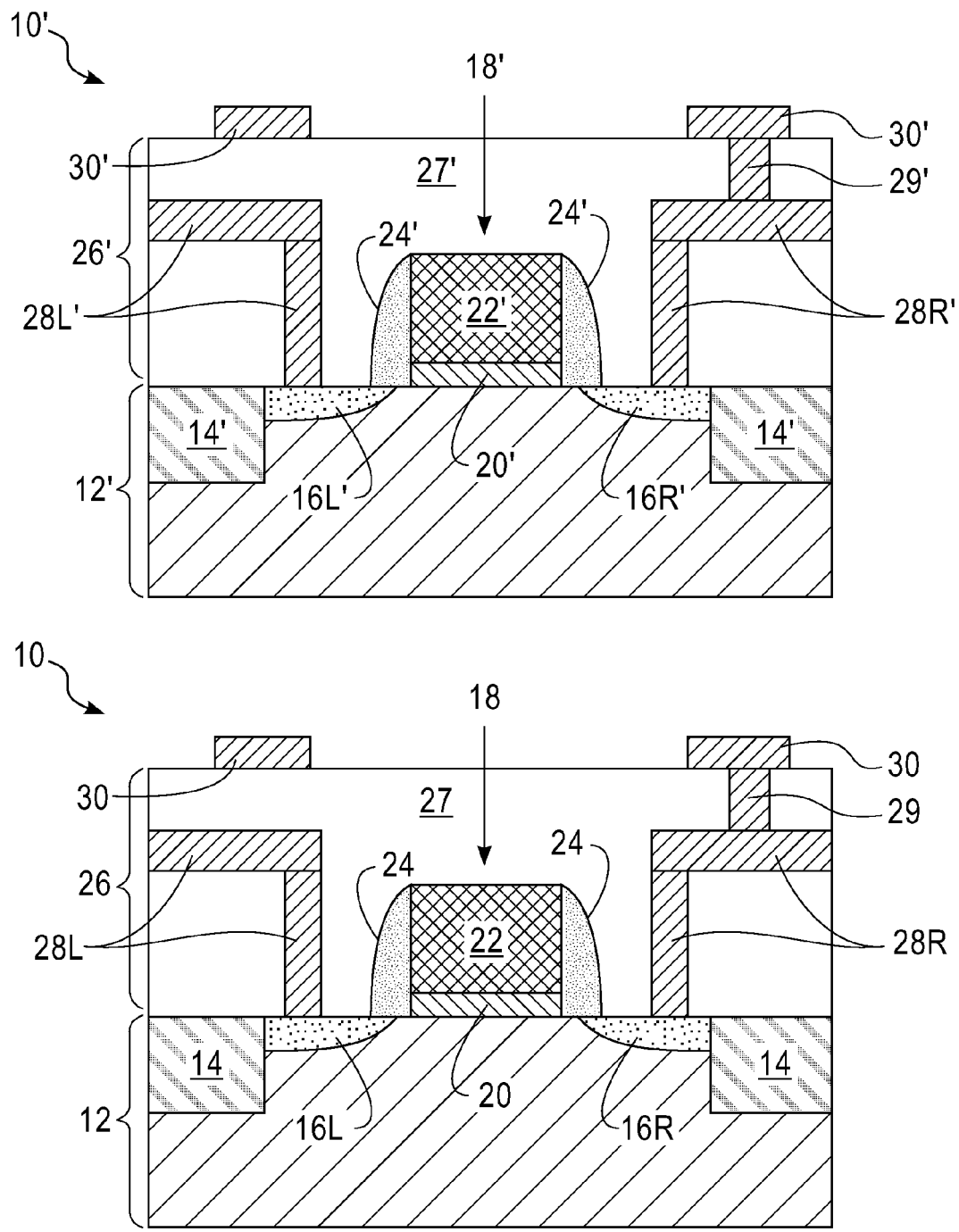
FIG. 12 is a pictorial representation (through a cross sectional view) illustrating two device wafers, both of which include a patterned Cu bond pad, that can be employed in a further embodiment of the present disclosure.
Figure 13:
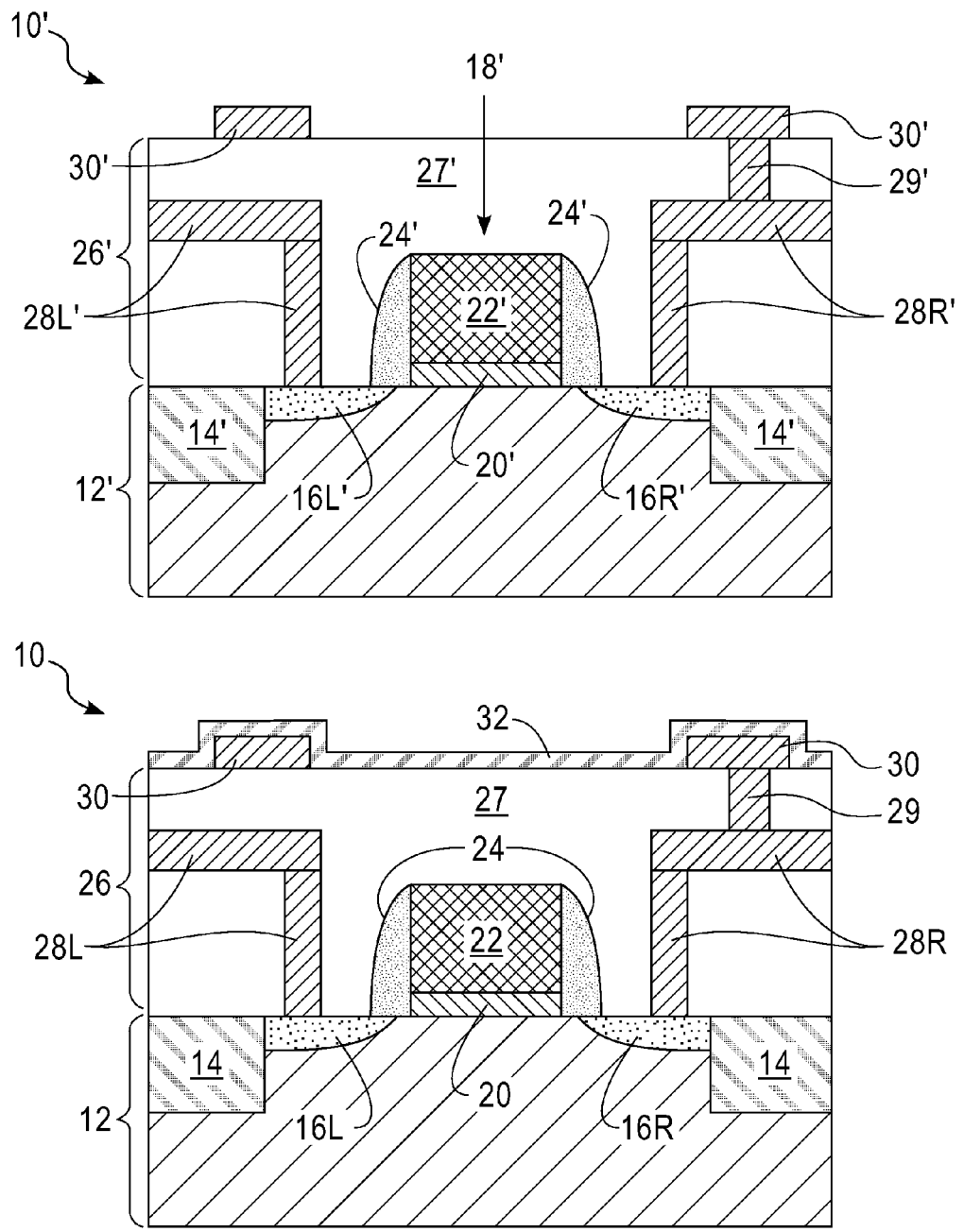
FIG. 13 is a pictorial representation (through a cross sectional view) illustrating the two device wafers of FIG. 12 after forming at least one metal adhesion layer on the patterned Cu bond pad of at least one of the device wafers.

Referring now to FIG. 13, there is illustrated the two device wafers 10 and 10' of FIG. 12 after forming at least one metal adhesion layer 32 on the patterned Cu bond pad of at least one of the device wafers. In some embodiment, another metal adhesion layer 32 can be formed on both device wafers. The at least one metal adhesion 32 is the same as mentioned above in conjunction with the structure illustrated in FIG. 3.

Figure 14:
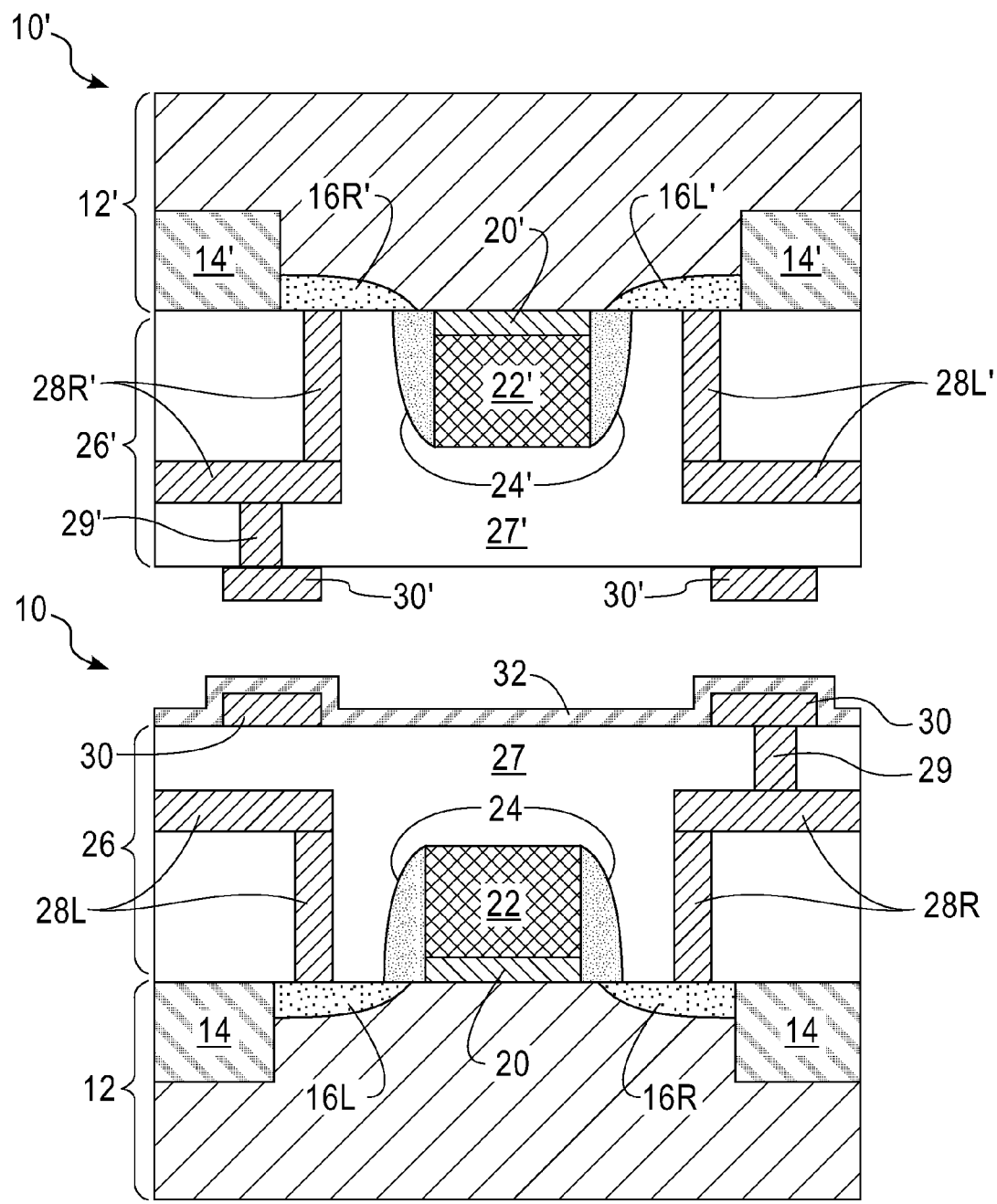
FIG. 14 is a pictorial representation (through a cross sectional view) illustrating the two device wafers of FIG. 13 after rotating one of the device wafers by 180° and aligning the patterned Cu bond pads of one of the device wafers to the patterned Cu bond pads of the other device wafer.

Referring now to FIG. 14, there is illustrated the two device wafers 10 and 10' of FIG. 13 after flipping one of the device wafers (i.e., device wafer 10") and aligning the patterned Cu bond pad 30 of the first device wafer 10 to the patterned Cu bond pad 30' of the second device wafer 10'. The flipping is achieved by rotating one of the device wafers, i.e., the second device wafer 10', by 180°.

Figure 15:
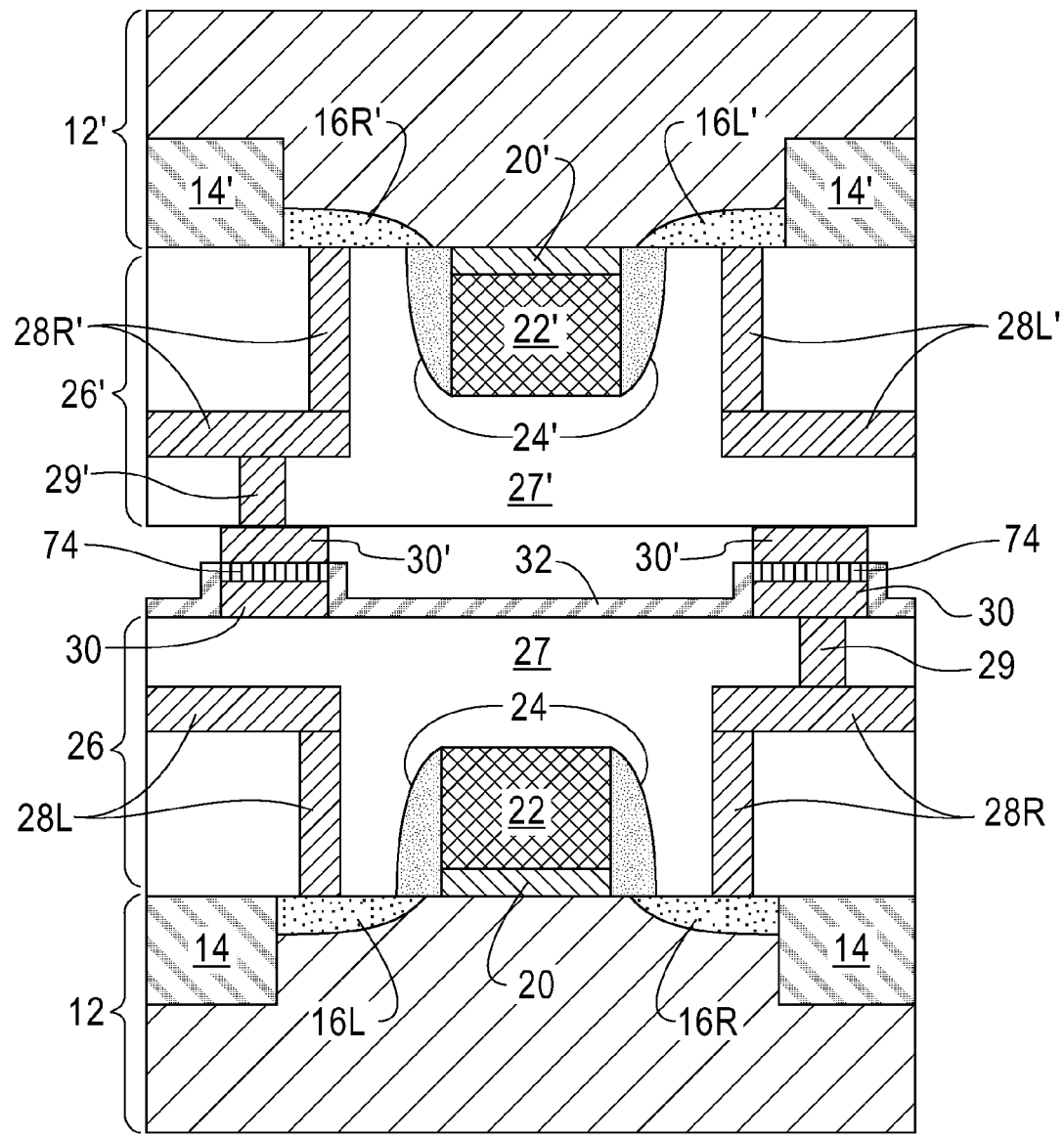
FIG. 15 is a pictorial representation (through a cross sectional view) illustrating the two devices wafers of FIG. 14 after bonding at a temperature of less than 400° C.

Referring to FIG. 15, there is illustrated the two devices wafers 10 and 10' of FIG. 14 after bonding at a temperature of less than 400° C. Other details and embodiments of the bonding process described in conjunction with forming the bonding structure illustrated in FIG. 5 can also be used here for forming the bonded structure illustrated in FIG. 9.

Further device wafers can be stacked atop the bonded structure shown in FIG. 14 and bonding between the further device wafers and the bonded structure can be achieved utilizing the same basic processing steps as described above. As such, a 3D integrated circuit can be formed including multiple device wafers stacked vertically one atop the other.

Figure 16:
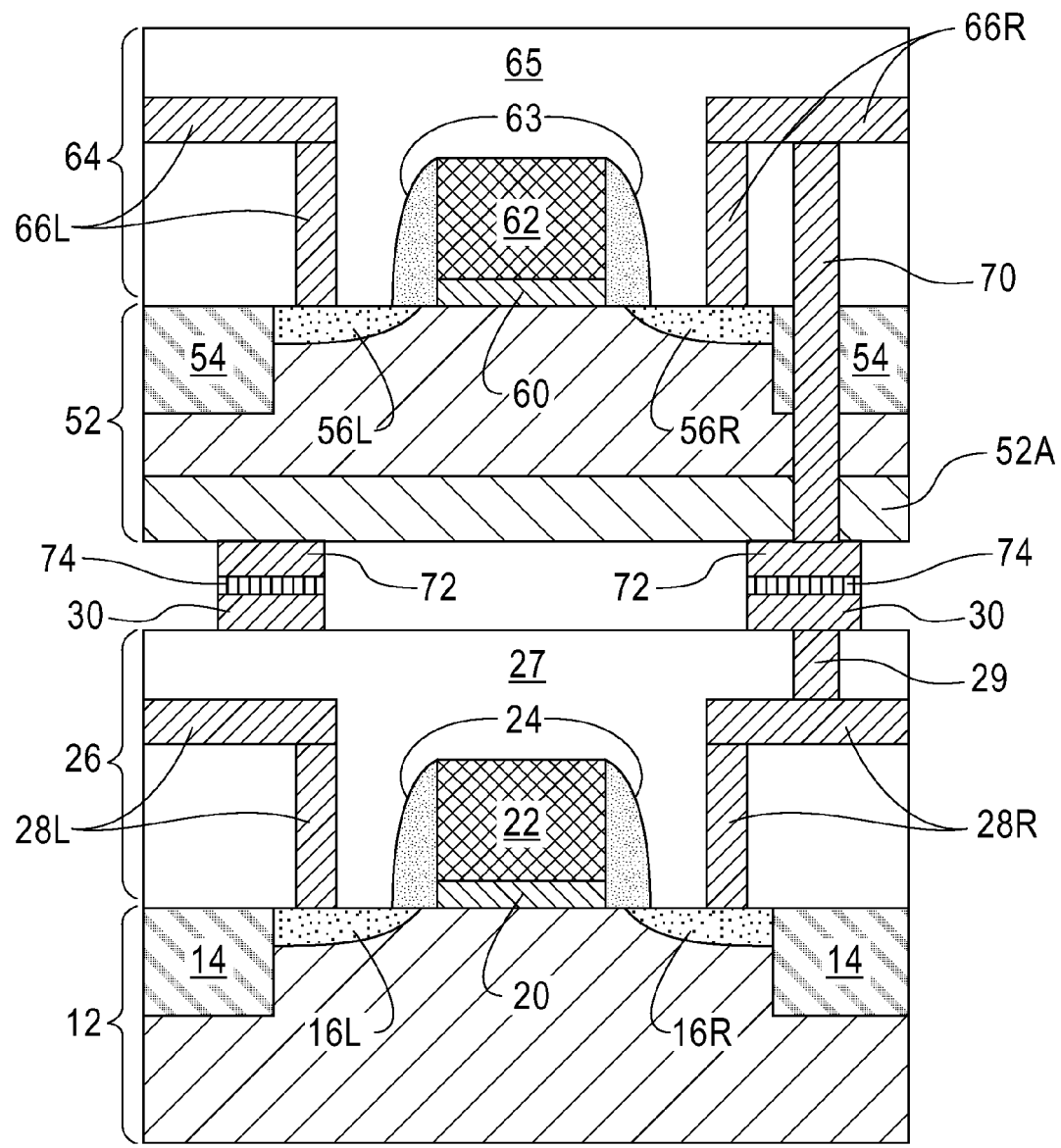
FIG. 16 is a pictorial representation (through a cross sectional view) illustrating a 3D integrated circuit that can be formed using the basic processing steps shown in FIGS. 2-6 except that a selective deposition process is used in forming the metal adhesion layer.

Referring now to FIG. 16, there is illustrated a 3D integrated circuit that can be formed using the basic processing steps shown in FIGS. 2-6 except that a selective deposition process is used in forming the metal adhesion layer. As such, no metal adhesion layer contacts the interconnect dielectric material of either the first and second device wafers. The selective deposition can be achieved by chemical vapor deposition or atomic layer deposition onto untreated or modified surfaces of a Cu/dielectric pattern. A typical example is the selective deposition of Mn or Co by chemical vapor deposition processing.

Figure 17:
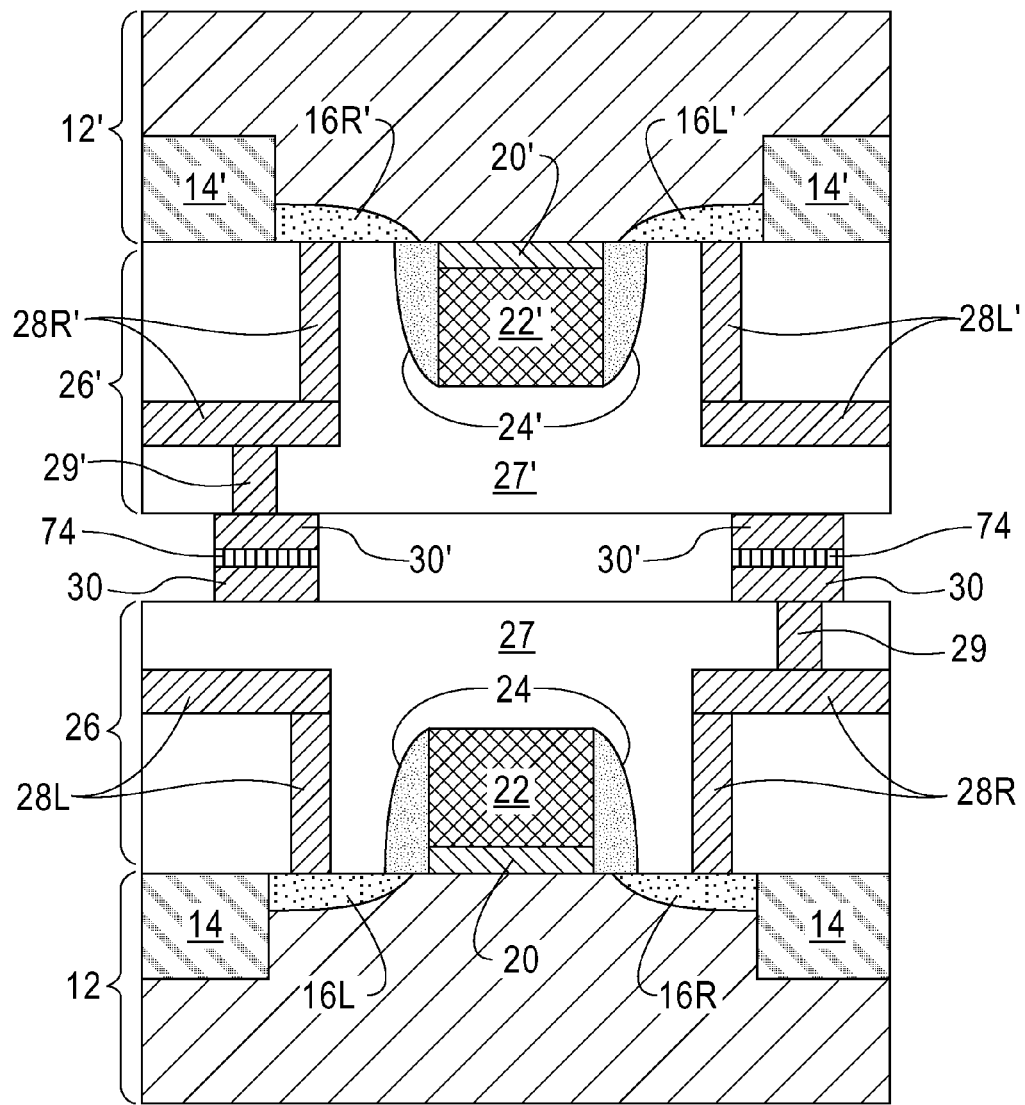
FIG. 17 is a pictorial representation (through a cross sectional view) illustrating a 3D integrated circuit that can be formed using the basic processing steps shown in FIGS. 12-15 except that a selective deposition process is used in forming the metal adhesion layer.

Referring now to FIG. 17, there is illustrated a 3D integrated circuit that can be processed using the basic processing steps shown in FIGS. 12-15 except that a selective deposition process is used in forming the metal adhesion layer. As such, no metal adhesion layer contacts the interconnect dielectric material of either the first and second device wafers. The selective deposition can be achieved by chemical vapor deposition or atomic layer deposition onto untreated or modified surfaces of a Cu/dielectric pattern. A typical example is the selective deposition of Mn or Co by chemical vapor deposition processing.

In some embodiments of the present disclosure, the above processing steps can be used to bond a non-patterned Cu bond pad from one device wafer to at least one patterned Cu bond pad from another device wafer.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A three-dimensional (3D) integrated circuit comprising:
a vertical stack of a first device wafer comprising a Cu surface and a second device wafer comprising another Cu surface, wherein a metal oxide bonding layer is located between the first Cu surface of the first device wafer and the another Cu surface of the second device wafer.

2. The 3D integrated circuit of claim 1, wherein said Cu surface of the first device wafer and said another Cu surface of the second device wafer are Cu bond pads, and each Cu bond pad is patterned.

3. The 3D integrated circuit of claim 1, wherein said Cu surface of the first device wafer and said another Cu surface of the second device wafer are Cu bond pads, and each Cu bond pad is non-patterned.

4. The 3D integrated circuit of claim 1, wherein said metal oxide bonding layer is vertically coincident to sidewalls of each of said Cu bond pads.

5. The 3D integrated circuit of claim 1, wherein a portion of a metal adhesion layer is present atop at least one of the device wafers.

6. The 3D integrated circuit of claim 5, wherein said metal adhesion layer comprises one of Mn, Ti, Ta, Co, W, Ru, and Ni or an alloy including a combination of two or more metals selected from Mn, Ta, Ti, Co, W, Ru and Ni.

7. The 3D integrated circuit of claim 1, wherein said metal oxide bonding layer comprises an oxide of at least one of Mn, Ti, Ta, Co, W, Ru, and Ni or an alloy including a combination of two or more metals selected from Mn, Ta, Ti, Co, W, Ru and Ni.

8. The 3D integrated circuit of claim 1, wherein said first device wafer comprises a field effect transistor and said second device wafer comprises another field effect transistor.

9. The 3D integrated circuit of claim 1, wherein said at least one Cu surface is located atop an uppermost surface of an interconnect level.

10. The 3D integrated circuit of claim 9, wherein said interconnect level comprises at least one interconnect dielectric material having a plurality conductive features located therein, wherein at least one of the conductive features is in contact with a bottommost portion of the Cu surface of the first device wafer.

11. The 3D integrated circuit of claim 1, wherein said first device wafer comprises a semiconductor substrate having at least one device located at least partially thereon, and an interconnect level located atop the semiconductor substrate.

12. The 3D integrated circuit of claim 11, wherein said interconnect level comprises a plurality of conductive features embedded within at least one interconnect dielectric material, wherein a conductive region connects one of said plurality of conductive features to said Cu surface.

13. The 3D integrated circuit of claim 12, wherein said second device wafer comprises, from bottom to top, an insulator layer, a semiconductor device layer, at least one other device located at least partially on said semiconductor device layer, and another interconnect level.

14. The 3D integrated circuit of claim 13, wherein said another interconnect level comprises a plurality of other conductive features embedded within at least one other interconnect dielectric material, wherein a through via connects at least one of the other conductive features to a bottommost portion of the another Cu surface, and wherein said Cu surface of said first device wafer and said another Cu surface of said second device wafer are patterned Cu bond pads.

15. The 3D integrated circuit of claim 12, wherein said second device wafer comprises another semiconductor substrate having at least one other device located at least partially thereon, and another interconnect level located atop the another semiconductor substrate.

16. The 3D integrated circuit of claim 15, wherein said another interconnect level comprises a plurality of other conductive features embedded within at least one other interconnect dielectric material, said other semiconductor substrate is located atop said at least one other device, and wherein said Cu surface of the first device wafer and said another Cu surface of the second device wafer are patterned Cu bond pads.

17. The 3D integrated circuit of claim 5, wherein said metal oxide bonding layer is a multilayered structure and said metal adhesion layer is a multilayered structure.

* * * * *